US009477071B2

(12) United States Patent
Zhou et al.

(10) Patent No.: US 9,477,071 B2
(45) Date of Patent: *Oct. 25, 2016

(54) METHOD AND DEVICE FOR CONCENTRATING, COLLIMATING, AND DIRECTING LIGHT

(71) Applicant: Hong Kong Applied Science and Technology Research Institute Co. Ltd., Shatin (HK)

(72) Inventors: Wei Zhou, Shenzhen (CN); Ming Lu, New Taipei (TW); Xuyan Huang, Wong Tai Sin (HK)

(73) Assignee: Hong Kong Applied Science and Technology Research Institute Co. Ltd., Shatin (HK)

( * ) Notice: Subject to any disclaimer, the term of this patent is extended or adjusted under 35 U.S.C. 154(b) by 51 days.

This patent is subject to a terminal disclaimer.

(21) Appl. No.: 14/500,523

(22) Filed: Sep. 29, 2014

(65) Prior Publication Data

US 2015/0027536 A1   Jan. 29, 2015

Related U.S. Application Data

(63) Continuation of application No. 13/187,327, filed on Jul. 20, 2011, now Pat. No. 8,847,142.

(51) Int. Cl.
*G02B 6/26* (2006.01)
*G02B 19/00* (2006.01)
(Continued)

(52) U.S. Cl.
CPC ............ *G02B 19/0042* (2013.01); *F24J 2/067* (2013.01); *F24J 2/12* (2013.01); *G02B 6/2852* (2013.01); *G02B 17/002* (2013.01); *G02B 19/0023* (2013.01); *G02B 19/0028* (2013.01); *G02B 19/0076* (2013.01); *H01L 31/0525* (2013.01); *H01L 31/0547* (2014.12); (Continued)

(58) Field of Classification Search
CPC ........................................ Y02E 10/40–10/45
USPC .......................... 126/683–713; 136/214, 215
See application file for complete search history.

(56) References Cited

U.S. PATENT DOCUMENTS 3,780,722 A   12/1973   Swet
4,074,704 A   2/1978   Gellert
(Continued)

FOREIGN PATENT DOCUMENTS

CN   1580667   2/2005
CN   1963591   5/2007
(Continued)

OTHER PUBLICATIONS

PCT/CN2012/078894 / WO2013010496: Application as filed on Jul. 19, 2012, 29 pages.
(Continued)

*Primary Examiner* — Renee Chavez
(74) *Attorney, Agent, or Firm* — Berkeley Law & Technology Group, LLP

(57) ABSTRACT

An optical system for light energy concentration may comprise a light concentrator to convert incident light to converging light, a light collimating element to receive the converging light and to reduce an angle of convergence of the converging light, and a light directing element to direct the reduced-angle converging light to a light guide to transmit the directed light.

25 Claims, 9 Drawing Sheets

(51) Int. Cl.
- *F24J 2/06* (2006.01)
- *F24J 2/12* (2006.01)
- *G02B 6/28* (2006.01)
- *G02B 17/00* (2006.01)
- *H01L 31/052* (2014.01)
- *H01L 31/054* (2014.01)

(52) U.S. Cl.
CPC ............... *G02B 6/262* (2013.01); *Y02E 10/42* (2013.01); *Y02E 10/52* (2013.01)

(56) References Cited

U.S. PATENT DOCUMENTS

| | | | |
|---|---|---|---|
| 4,411,490 | A | 10/1983 | Daniel |
| 4,841,946 | A | 6/1989 | Marks |
| 6,672,740 | B1 | 1/2004 | Li |
| 7,975,685 | B2 | 7/2011 | Zhao |
| 8,847,142 | B2 | 9/2014 | Zhou et al. |
| 2008/0087276 | A1 | 4/2008 | Zhao |
| 2008/0202500 | A1 | 8/2008 | Hodges |
| 2008/0271776 | A1 | 11/2008 | Morgan |
| 2009/0067784 | A1 | 3/2009 | Ghosh et al. |
| 2009/0071466 | A1 | 3/2009 | Penciu |
| 2010/0032005 | A1 | 2/2010 | Ford et al. |
| 2010/0108124 | A1 | 5/2010 | Knox et al. |
| 2010/0116319 | A1 | 5/2010 | Anton |
| 2010/0116336 | A1 | 5/2010 | Anton et al. |
| 2010/0212717 | A1 | 8/2010 | Whitlock et al. |
| 2011/0162712 | A1 | 7/2011 | Tillin et al. |
| 2011/0203662 | A1 | 8/2011 | Minano et al. |
| 2011/0226332 | A1 | 9/2011 | Ford et al. |

FOREIGN PATENT DOCUMENTS

| | | |
|---|---|---|
| CN | 101174027 | 5/2008 |
| CN | 101561553 | 10/2009 |
| CN | 101922672 | 12/2010 |
| CN | 102122061 | 7/2011 |
| CN | 102608739 | 7/2012 |
| WO | 2010033859 A2 | 3/2010 |

OTHER PUBLICATIONS

PCT/CN2012/078894 / WO2013010496: Publication of application, published Jan. 24, 2013, 33 pages.
PCT/CN2012/078894 / WO2013010496: International search report, mailed Nov. 18, 2012, 6 pages.
PCT/CN2012/078894 / WO2013010496: Written opinion, mailed Oct. 19, 2012, 6 pages.
PCT/CN2012/078894 / WO2013010496: International Preliminary Report on Patentability, mailed Jan. 21, 2014, 7 pages.
CN20111226558 / CN102313975: SIPO CN first office action, mailed Oct. 10, 2012, 5 pages.
CN20111226558 / CN102313975: SIPO CN second office action, mailed Apr. 22, 2013, 5 pages.
CN20111226558 / CN102313975: SIPO CN third office action, mailed Oct. 24, 2013, 5 pages.
U.S. Appl. No. 13/187,327, filed Jul. 20, 2011, 121 pages.
U.S. Appl. No. 13/187,327 / Notice to File Corrected Application Papers, Filed Aug. 4, 2011, 2 pages.
U.S. Appl. No. 13/187,327 / Filing Receipt, Mailed Aug. 4, 2011, 3 pages.
U.S. Appl. No. 13/187,327 / Request for Early Publication, Filed Aug. 15, 2011, 1 page.
U.S. Appl. No. 13/187,327 / Applicant Response to PEFR, Filed Sep. 7, 2011, 11 pages.
U.S. Appl. No. 13/187,327 / Filing Receipt, mailed Sep. 19, 2011, 3 pages.
U.S. Appl. No. 13/187,327 / Notice of Publication, mailed Dec. 30, 2011, 1 page.
U.S. Appl. No. 13/187,327 / Non Final Rejection, mailed Apr. 10, 2013, 14 pages.
U.S. Appl. No. 13/187,327 / Amendment/Request for Reconsideration After Non Final Rejection, filed Jul. 8, 2013, 17 pages.
U.S. Appl. No. 13/187,327 / Examiner Initiated Interview Summary, mailed Aug. 26, 2013, 2 pages.
U.S. Appl. No. 13/187,327 / Final Rejection, mailed Sep. 5, 2013, 17 pages.
U.S. Appl. No. 13/187,327 / Request for Continued Examination, filed Jan. 24, 2014, 17 pages.
U.S. Appl. No. 13/187,327 / Notice of Allowance and Fees Due, mailed Mar. 11, 2014, 12 pages.
U.S. Appl. No. 13/187,327 / Filing Receipt, mailed May 8, 2014, 3 pages.
U.S. Appl. No. 13/187,327 / Request for Continued Examination, Filed May 16, 2014, 3 pages.
U.S. Appl. No. 13/187,327 / Notice of Allowance and Fees Due, mailed Jun. 5, 2014, 11 pages.
U.S. Appl. No. 13/187,327 / Issue Notification, mailed Sep. 10, 2014, 1 page.

METHOD AND DEVICE FOR CONCENTRATING, COLLIMATING, AND DIRECTING LIGHT

CROSS-REFERENCE TO RELATED APPLICATION

This application is a continuation of U.S. patent application Ser. No. 13/187,327, filed on Jul. 20, 2011, titled "METHOD AND DEVICE FOR CONCENTRATING, COLLIMATING, AND DIRECTING LIGHT," and scheduled to issue on Sep. 30, 2014 as U.S. Pat. No. 8,847,142, and which is hereby incorporated herein by reference in its entirety.

FIELD

The subject matter disclosed herein relates to an optical system, and more particularly, to a concentrating photovoltaic system for light energy concentration.

BACKGROUND

Though sunlight, the energy source of solar power generation, is virtually free and abundant, these benefits of sunlight may be offset by a relatively high expense associated with solar power generating photovoltaic (PV) cells. Also, corresponding to relatively low efficiency of such PV cells, a relatively large area may be occupied by PV cells in order to generate a desired amount of electrical power. Accordingly, improvements in efficiency of PV cells may lead to reduced cost for solar power generation and/or increased capacity to generate solar power.

A concentrating photovoltaic (CPV) system may operate by focusing sunlight via optical elements onto relatively small solar cells to reduce use of costly solar cell materials, for example. CPV technology is a relatively important method for converting sun energy into electricity.

BRIEF DESCRIPTION OF THE DRAWINGS

Non-limiting and non-exhaustive embodiments will be described with reference to the following objects, wherein like reference numerals refer to like parts throughout the various objects unless otherwise specified.

DETAILED DESCRIPTION

Figure 1:
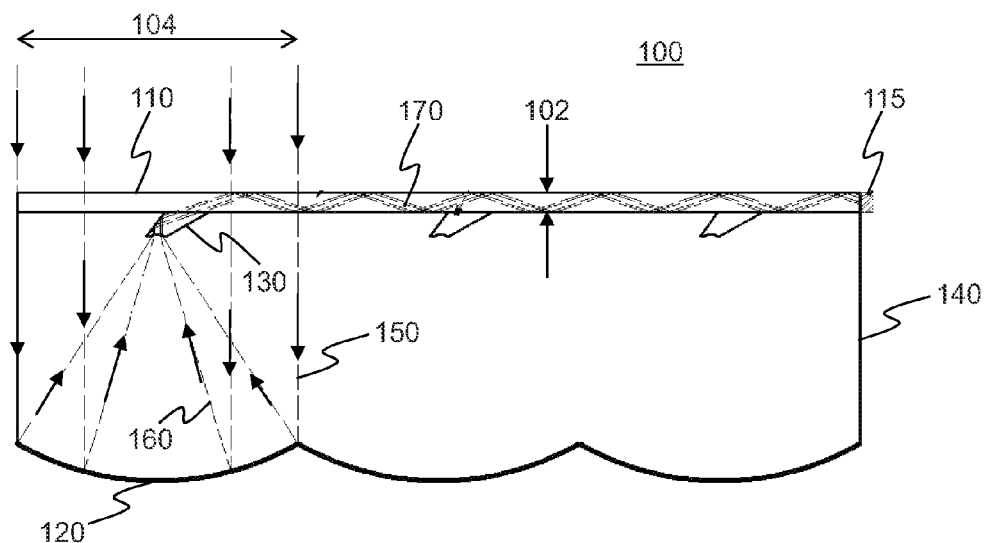
FIG. 1 is a cross-section of a light concentration system, according to an embodiment.

In the following detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

In an embodiment, a light concentrating system may comprise one or more light concentrators and a light guiding structure. Such a system may focus sunlight, for example, via optical elements onto relatively small photovoltaic (PV) cells to convert sun energy into electricity. Light concentrators may concentrate incident sun light onto light collimation and/or directing elements. For example, a light collimation and/or directing element may collimate concentrated incident light into relatively small convergence angles and direct the collimated light to a light guiding structure, as described in further detail below. One advantage, among others, provided by performing such collimation may be in that light loss due to decoupling effects may be eliminated or reduced in a light guide structure to transport light to an energy conversion element. In an implementation, an energy conversion element to convert light into different forms of energy, such as electricity and thermal, for example, may comprise PV cells and/or heat exchange devices, though claimed subject matter is not so limited.

In an embodiment, one or more light collimating and/or directing elements may be located at intervals external to a light guide so that the light collimating and/or directing elements are outside an optical path of light travelling in the light guide. Locating light collimating and/or directing elements in such a way may provide an advantage in that light collimating and/or directing elements need not block light travelling in a light guide. As a counter example, light collimating and/or directing elements physically located inside a light guide may block portions of light as the light travels along the light guide. In an implementation, a light guide, such as a rod type of light guide, may be used to transmit light toward an energy conversion element physically and/or optically attached at an end region of the light guide. Light from more than one light concentrator may share the same light guide, though claimed subject matter is not so limited.

In some embodiments, a light collimating and/or directing element may be combined into a single optical element, called a collimation and directing element (CDE). For example, a CDE may include at least one surface located relatively close to a focus point of a light concentrator to receive light from the light concentrator.

Light concentrators to collect light over a relatively large area and concentrate the collected light into a relatively small area may comprise refractive lenses or a combination of refractive lens (e.g., compound lenses), and/or Fresnel lenses, just to name a few examples. Such light concentrators may have an associated focal length determining a distance at which light reflecting from (or transmitting through) the light concentrators may be focused. Additionally, such light concentrators may have an associated numerical aperture (N.A.) determining an angle of convergence of a cone of light reflecting from the light concentrators. Such an angle of convergence may be described in terms of an f-number: An f-number (sometimes called focal ratio, f-ratio, f-stop, or relative aperture, for example) may express a focal length divided by an effective aperture diameter of a light concentrator, for example. An f-number may comprise a dimensionless number that is a quantitative measure of lens speed or steepness of a cone of light, for example. Light concentrators may concentrate light by converging light at a particular f-number and focusing at a particular focal length. Optical elements downstream of such light concentrators may be arranged based, at least in part, on a focal length and/or N.A. of the light concentrators, for example. An array of such light concentrators may comprise one or more light concentrators arranged in any number of possible patterns. In a particular example, such an array may comprise light concentrators arranged in rows and columns.

In an embodiment, a method to collect and/or concentrate light may comprise collecting and focusing incident light onto a light collimating element to increase an f-number of the incident light. The method may further comprise steering the f-number-increased light received from the light collimating element through a light guide, and transmitting the steered light to an energy converting device via the light guide. In one implementation, the light collimating element may perform the light steering. In another implementation, a light directing element may perform the light steering. Increasing an f-number of incident light may be performed by a curved surface of an optical element. A method may further comprise combining steered light from a plurality of light collimating elements.

FIG. 1 is a cross-section of a light concentration system 100, according to an embodiment. System 100 may comprise an arrangement of optical elements such as lenses, mirrors, waveguides, and so on, to concentrate light spread over an area defined by a length 104 into a substantially smaller area defined by a length 102, for example. In particular, system 100 may include one or more light concentrators 120 to convert incident light 150 to a converging cone of light 160. Light concentrator 120 may comprise a curved mirror, such as a parabolic or spherical reflector, for example. In one implementation, a curved mirror may comprise any type of material, such as glass, plastic, or metal that may include one or more reflective coatings. Light 150, which may comprise substantially parallel light from the sun, may impinge on a curved surface of light concentrator 120 and be reflected into a cone of converging light 160. For example, light 150 reflected from light concentrator 120 may be focused into a cone of light 160 having a particular f-number. Light 160 may be focused toward a CDE 130 optically attached to a light guide 110. Such a CDE is described in further detail below. CDE 130 may direct light that it receives into light guide 110, which may carry the directed light 170 to an energy conversion element 115, for example. Light beams from more than one concentrator may share a light guide. Energy conversion element may comprise one or more devices able to convert concentrated light to another form of energy, such as electricity (e.g., via photovoltaic cells) or heat (e.g., via a heat exchanger), just to name a few examples. In a particular implementation, a structure to provide physical support to one or more light concentrators 120 and/or light guide 110 may include element 140, which may comprise a rigid material to maintain a constant distance between light concentrators 120 and light guide 110, for example.

In an implementation, CDE 130 may be selected to be relatively small to reduce light blocking of incident light 150. However, a size and dimensions of CDE 130 may be sufficiently large to meet design tolerances involving, for example, angle deviation of incident light 150, CDE placement or alignment with light concentrator 120, reflecting angles of interior surfaces of the CDE, and/or size of a collimating portion of the CDE to receive light from light concentrator 120.

Figure 2:
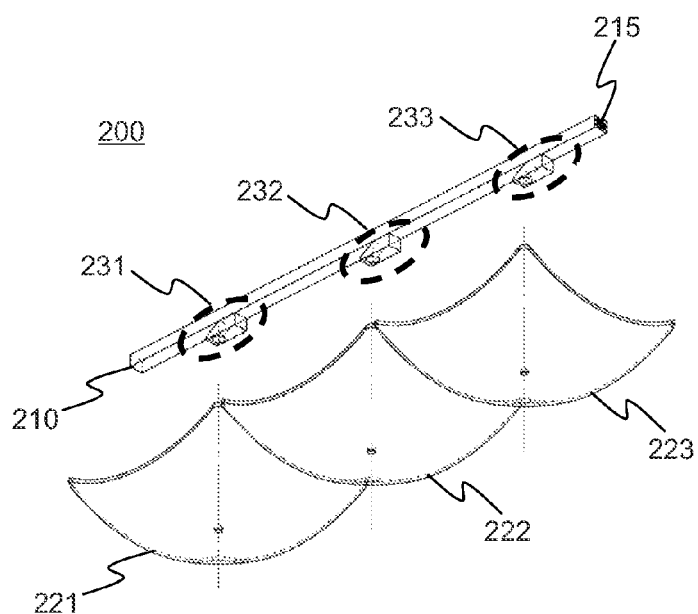
FIG. 2 is a perspective view of a light concentration system, according to an embodiment.

FIG. 2 is a perspective view of a light concentration system 200, according to an embodiment. System may be similar to system 100 shown in FIG. 1, for example. Light concentrators 221, 222, and 223 may focus light into CDEs 231, 232, and 233, respectively. The light concentrators may comprise parabolic or spherical reflectors positioned to reflect converging light to the CDEs. Light received by CDEs 231, 232, 233 may be coupled into light guide 210. Light guide 210 may comprise any of a number of types of light guides, such as a rod-type light guide, for example. Once coupled into light guide 210, light may travel along the inside of light guide 210 by way of total internal reflection, for example, to reach energy conversion element 215. Of course, such details of a light concentration system are merely examples, and claimed subject matter is not so limited.

Figure 3:
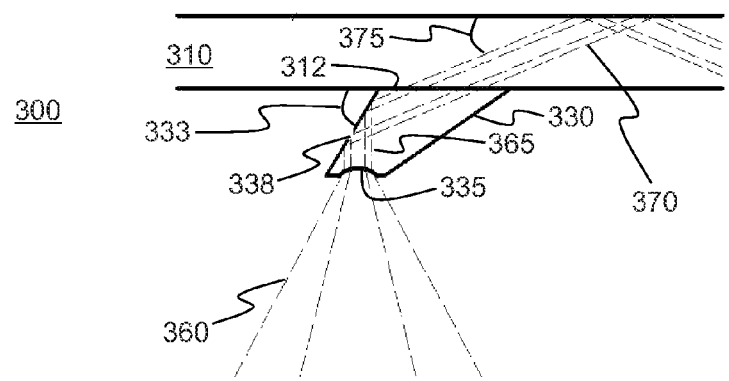
FIG. 3 is a cross-section of a portion of a light concentration system, according to an embodiment.

FIG. 3 is a cross-section of a portion of a light concentration system, according to an embodiment 300. CDE 330, optically attached to a light guide 310, may comprise an optical element including a light collimator 335 and a light director 338. Such an optical element may comprise quartz, sapphire, plastic, or other optical material, for example. In a particular implementation, light collimator 335 may comprise a concave depression in a surface of CDE 330. Light director 338 may comprise a flat reflective interior surface of CDE 330. In one implementation, a flat reflective interior surface of CDE 330 may reflect light by total internal reflection. In another implementation, a flat reflective surface of CDE 330 may comprise a reflective coating to reflect light internally in CDE 330, for example. In one implementation, light 360 entering light collimator 335 may be collimated to produce parallel light 365. In another implementation, light 360 entering light collimator 335 may be collimated to produce light 365 having a reduced convergence angle or increased f-number compared to light 360. For a specific example, an angle of convergence of light 360 may be about 60.0 degrees and an angle of convergence of light 365 may be about 20.0 degrees, though claimed subject matter is not so limited. Collimating light using a light collimator such as 335, for example, may provide benefits. For example, after collimation, a light path may be more easily controlled to avoid or to reduce decoupling effects.

Light director 338 may reflect light 365 at a particular angle based, at least in part, on an angle 333 between a surface of light guide 310 and a reflecting surface of light director 338. Thus, light director 338 may reflect light 365 at a particular angle so that the reflected light 370 enters light guide 310 at an angle 375 that allows total internal reflection to occur in light guide 310. Light 370 may travel along the interior of light guide 310 toward an energy converting element, for example, as shown in FIG. 1.

An optical interface 312 between CDE 330 and light guide 310 may comprise an adhesive having optical properties to hold CDE 330 to light guide 310. For example, an epoxy or other adhesive having relatively high transmittance may adhere CDE 330 and light guide 310 to one another. In other implementations, CDE 330 may be attached to light guide 310 by methods other than an adhesive. For example, straps, bolts, or other hardware (not shown) may be used to attach CDE 330 to light guide 310, though claimed subject matter is not so limited.

Figure 4:
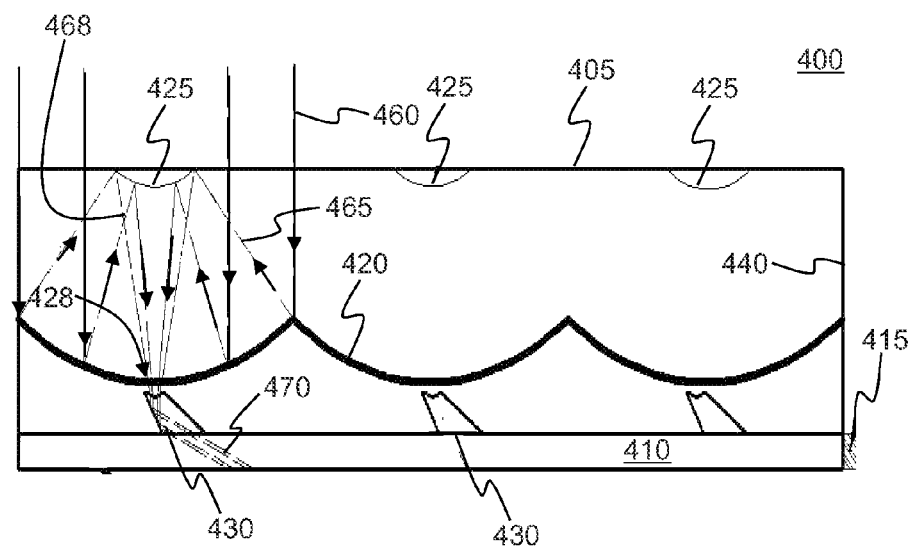
FIG. 4 is a cross-section of a light concentration system, according to another embodiment.

FIG. 4 is a cross-section of a light concentration system 400, according to another embodiment. Substantially collimated incident light 460 transmits through a support structure 405 that physically supports secondary mirrors 425. Light 460 then impinges on a light concentrator 420 comprising a parabolic or spherical reflecting surface, for example. Converging light 465 reflected from light concentrator 420 may be directed toward secondary mirror 425 that folds a light cone into aperture 428 in light concentrator 420. After passing through aperture 428, light 468 reflected from secondary mirror 425 may impinge on CDE 430, which may reduce a cone angle of light 468 and direct the resulting light into light guide 410. For example, a cone angle of light 468 may be reduced from about 60.0 to about 20.0 degrees or less. Resulting light 470 may travel along the interior of light guide 410 toward an energy converting element 415, for example.

In a particular implementation, a structure to provide physical support to one or more light concentrators 420, secondary mirrors 425, and/or light guide 410 may include element 440, which may comprise a rigid material to maintain a constant distance between elements in system 400, for example. Support structure 405 may comprise a piece of glass or other rigid material that is transparent to light.

Figure 5:
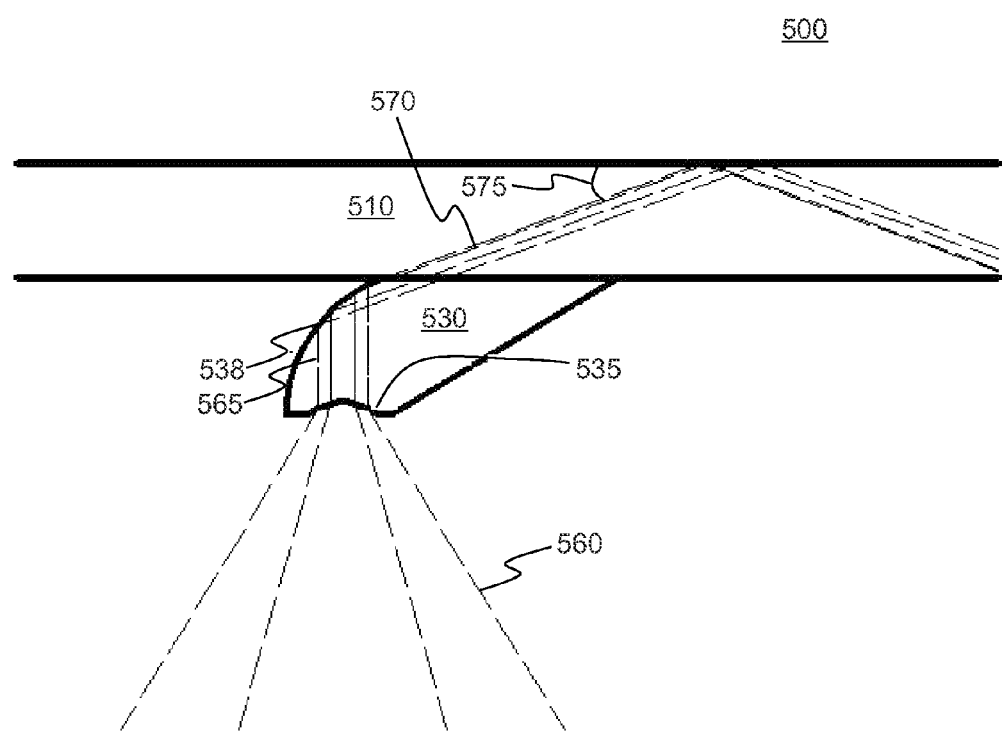
FIGS. 5-17 are cross-sections of a portion of a light concentration system, according to embodiments.

FIG. 5 is a cross-section of a portion of a light concentration system, according to an embodiment 500. CDE 530, optically attached to a light guide 510, may comprise an optical element including a light collimator 535 and a light director 538. In a particular implementation, light collimator 535 may comprise a concave depression in a surface of CDE 530. Light director 538 may comprise a curved reflective interior surface of CDE 530. Light director 538 may comprise any of a number of materials, such as glass, Polymethyl methacrylate (PMMA), or polycarbonate (PC), just to name a few examples. In one implementation, a curved reflective interior surface of CDE 530 may reflect light by total internal reflection. In another implementation, a curved reflective surface of CDE 530 may comprise a reflective coating to reflect light internally in CDE 530. In one implementation, light 560 entering light collimator 535 may be collimated to produce parallel light 565. In another implementation, light 560 entering light collimator 535 may be collimated to produce light 565 having a reduced convergence angle or increased f-number compared to light 560. Light director 538 may reflect light 565 at a particular angle based, at least in part, on a shape or curvature of the reflecting surface of light director 538. Thus, light director 538 may reflect light 565 at a particular angle so that the reflected light 570 enters light guide 510 with an angle 575 that allows total internal reflection to occur in light guide 510. Light 570 may travel along the interior of light guide 510 toward an energy converting element, for example, as shown in FIG. 1.

Figure 6:
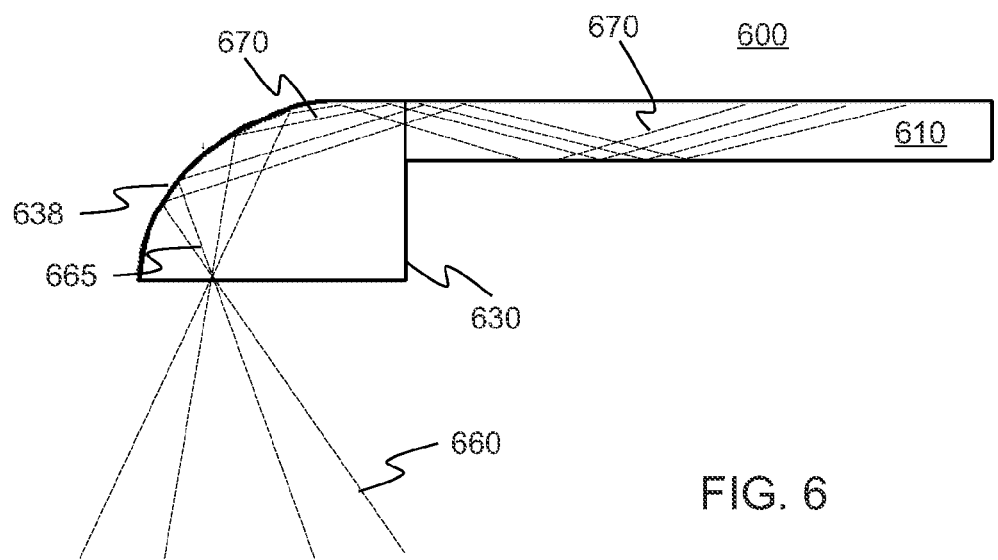

FIG. 6 is a cross-section of a portion of a light concentration system, according to an embodiment 600. CDE 630, optically attached to a light guide 610, may comprise an optical element including a curved surface 638, which may implement functions of a light collimator and/or a light director. As such, light 660 impinging on surface 638 may be both collimated and directed upon reflection. In one implementation, CDE 630 may be integrated with light guide 610 so that CDE 630 and light guide 610 comprise a single piece of optical material, for example. In another implementation, CDE 630 and light guide 610 may comprise separate pieces that are optically attached, for example. In such a case, light guide 610 may include at least two opposing plane surfaces, wherein transmitted light may travel from an entry-end surface (e.g., where CDE 630 may be located) toward an exit-end surface (e.g., where an energy conversion element may be located). Though claimed subject matter is not so limited, CDE 630 may be larger than light guide 610. Such a curved surface 638 may comprise a cylindrical, spherical, parabolic, or free form shape, just to name a few examples. Surface 638 may comprise any of a number of materials, such as glass, Polymethyl methacrylate (PMMA), or polycarbonate (PC), just to name a few examples. In one implementation, curved surface 638 may reflect light by total internal reflection. In another implementation, curved surface 638 may comprise a reflective coating to reflect light internally in CDE 630. Curved surface 638 may reflect light 665 at a particular angle based, at least in part, on a shape or curvature of the reflecting surface of curved surface 638 so that the reflected light 670 enters light guide 610 with an angle that allows total internal reflection to occur in light guide 610. Light 670 may travel along the interior of light guide 610 toward an energy converting element, for example, as shown in FIG. 1.

Figure 7:
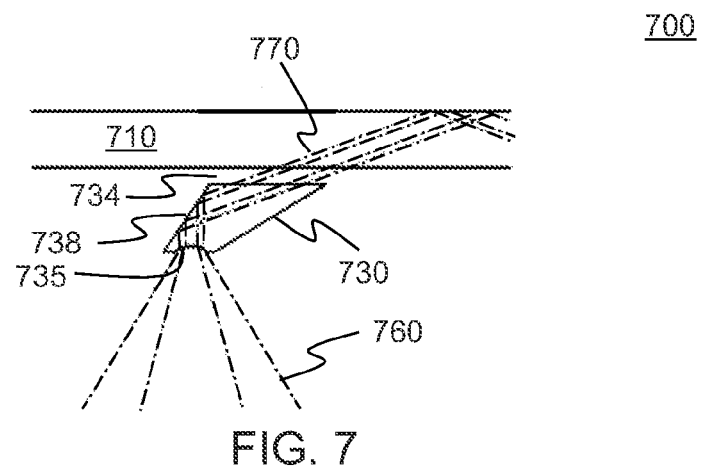

FIG. 7 is a cross-section of a portion of a light concentration system, according to an embodiment 700. Embodiment 700 may be similar to embodiment 300 shown in FIG. 3, except that CDE 730 and light guide 710 may be separated by a gap 734. Such a gap may be filled with air, for example. CDE 730 may comprise an optical element including a light collimator 735 and a light director 738. Such an optical element may comprise quartz, sapphire, or other optical material, for example. In a particular implementation, light collimator 735 may comprise a concave depression in a surface of CDE 730. Light director 738 may comprise a flat reflective interior surface of CDE 730.

Figure 8:
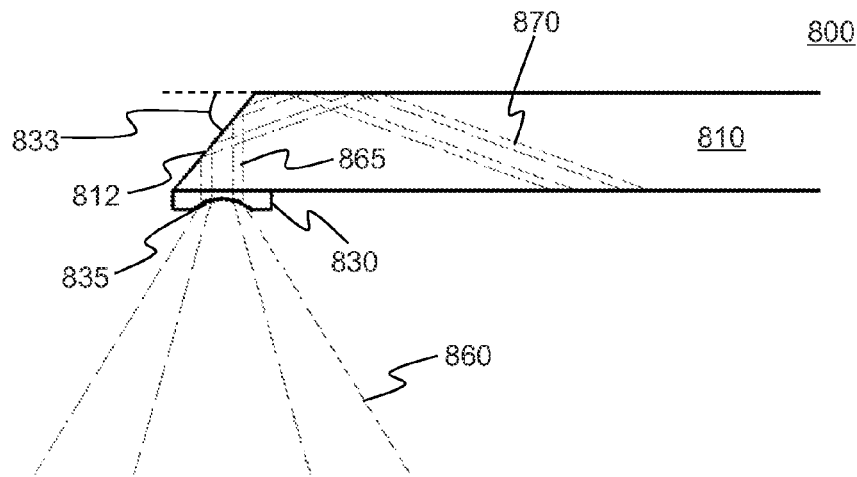

FIG. 8 is a cross-section of a portion of a light concentration system, according to an embodiment 800. A light collimator 830, optically attached to a light guide 810, may comprise a concave depression 835 in a surface of light collimator 830. Light director 812 may comprise a flat reflective interior surface at an end region of light guide 810. In one implementation, such a flat reflective interior surface may reflect light by total internal reflection. In another implementation, a flat reflective surface of light director 812 may comprise a reflective exterior coating to reflect light internally in light guide 810. In one implementation, light 860 entering light collimator 830 may be collimated to produce parallel light 865. In another implementation, light 860 entering light collimator 830 may be collimated to produce light 865 having a reduced convergence angle or increased f-number compared to light 860. Light director 812 may reflect light 865 at a particular angle based, at least in part, on an angle 833 of the reflecting surface of light director 812 with respect to a surface of light guide 810. Thus, light director 812 may reflect light 865 at a particular angle so that the reflected light 870 travels in light guide 810 with an angle that allows total internal reflection to occur in light guide 810. Light 870 may travel along the interior of light guide 810 toward an energy converting element, for example, as shown in FIG. 1.

Figure 9:
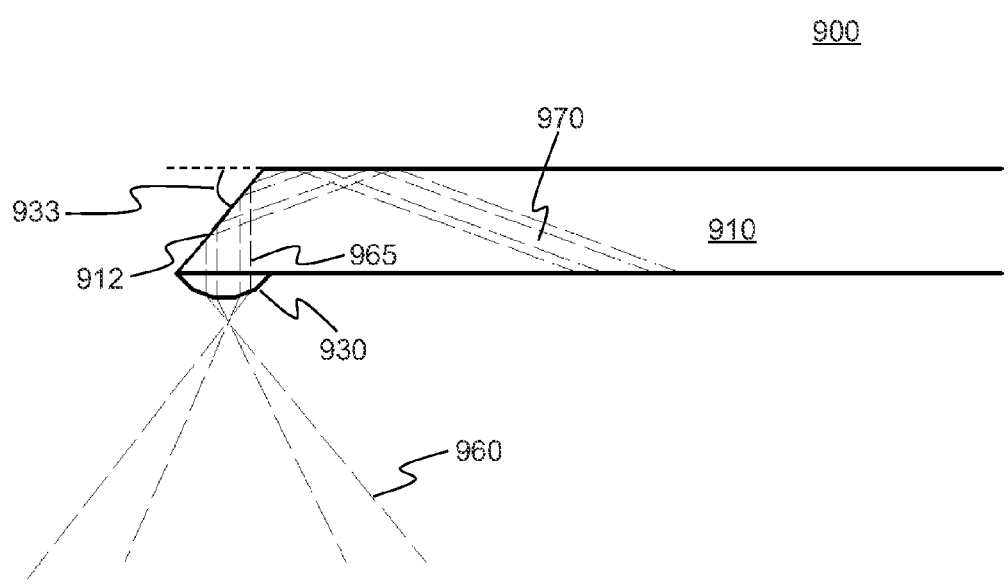

FIG. 9 is a cross-section of a portion of a light concentration system, according to an embodiment 900. A light collimator 930, optically attached to a light guide 910, may comprise a convex lens. Light director 912 may comprise a flat reflective interior surface at an end region of light guide 910. In one implementation, such a flat reflective interior surface may reflect light by total internal reflection. In another implementation, a flat reflective surface of light director 912 may comprise a reflective exterior coating to reflect light internally in light guide 910. In one implementation, depending at least in part on a focal length of light collimator 930, light 960 entering light collimator 930 may be collimated to produce parallel light 965. In another implementation, again depending at least in part on a focal length of light collimator 930, light 960 entering light collimator 930 may be collimated to produce light 965 having a reduced convergence angle or increased f-number compared to light 960. Light director 912 may reflect light 965 at a particular angle based, at least in part, on an angle 933 of the reflecting surface of light director 912 with respect to a surface of light guide 910. Thus, light director 912 may reflect light 965 at a particular angle so that the reflected light 970 travels in light guide 910 with an angle that allows total internal reflection to occur in light guide 910. Light 970 may travel along the interior of light guide 910 toward an energy converting element, for example, as shown in FIG. 1.

Figure 10:
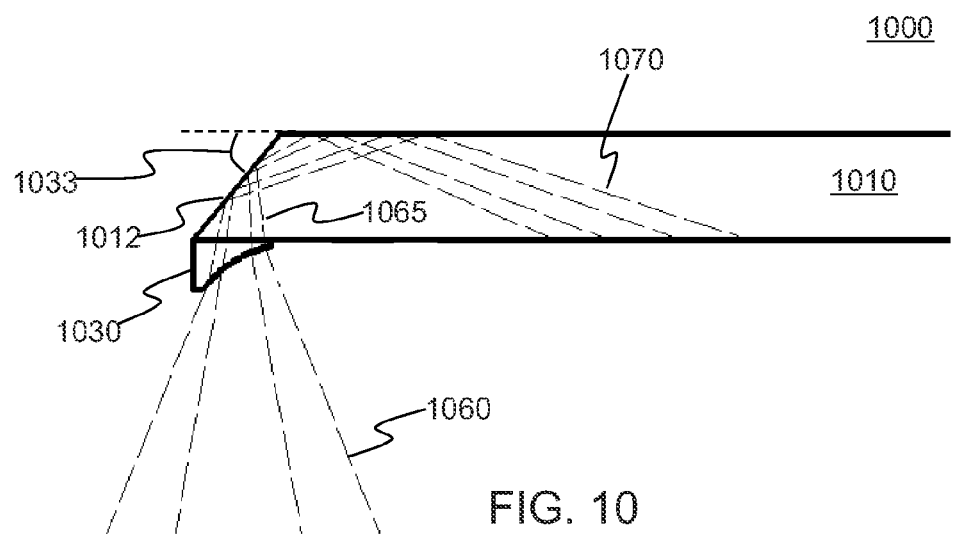

FIG. 10 is a cross-section of a portion of a light concentration system, according to an embodiment 1000. A light collimator 1030, optically attached to a light guide 1010, may comprise a concave lens (e.g., a concave cylindrical lens). Light director 1012 may comprise a flat reflective interior surface at an end region of light guide 1010. In one implementation, such a flat reflective interior surface may reflect light by total internal reflection. In another implementation, a flat reflective surface of light director 1012 may comprise a reflective exterior coating to reflect light internally in light guide 1010. In one implementation, depending at least in part on a focal length of light collimator 1030, light 1060 entering light collimator 1030 may be collimated to produce parallel light 1065. In another implementation, again depending at least in part on a focal length of light collimator 1030, light 1060 entering light collimator 1030 may be collimated to produce light 1065 having a reduced convergence angle or increased f-number compared to light 1060. Light director 1012 may reflect light 1065 at a particular angle based, at least in part, on an angle 1033 of the reflecting surface of light director 1012 with respect to a surface of light guide 1010. Thus, light director 1012 may reflect light 1065 at a particular angle so that the reflected light 1070 travels in light guide 1010 with an angle that allows total internal reflection to occur in light guide 1010. Light 1070 may travel along the interior of light guide 1010 toward an energy converting element, for example, as shown in FIG. 1.

Figure 11:
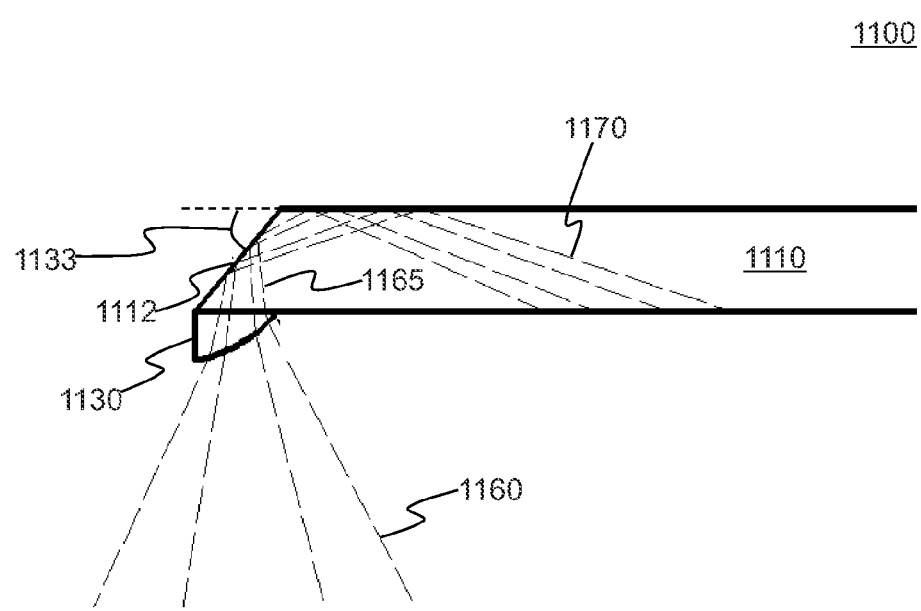

FIG. 11 is a cross-section of a portion of a light concentration system, according to an embodiment 1100. A light collimator 1130, optically attached to a light guide 1110, may comprise a convex lens (e.g., a convex cylindrical lens). Light director 1112 may comprise a flat reflective interior surface at an end region of light guide 1110. In one implementation, such a flat reflective interior surface may reflect light by total internal reflection. In another implementation, a flat reflective surface of light director 1112 may comprise a reflective exterior coating to reflect light internally in light guide 1110. In one implementation, depending at least in part on a focal length of light collimator 1130, light 1160 entering light collimator 1130 may be collimated to produce parallel light 1165. In another implementation, again depending at least in part on a focal length of light collimator 1130, light 1160 entering light collimator 1130 may be collimated to produce light 1165 having a reduced convergence angle or increased f-number compared to light 1160. Light director 1112 may reflect light 1165 at a particular angle based, at least in part, on an angle 1133 of the reflecting surface of light director 1112 with respect to a surface of light guide 1110. Thus, light director 1112 may reflect light 1165 at a particular angle so that the reflected light 1170 travels in light guide 1110 with an angle that allows total internal reflection to occur in light guide 1110. Light 1170 may travel along the interior of light guide 1110 toward an energy converting element, for example, as shown in FIG. 1.

Figure 12:
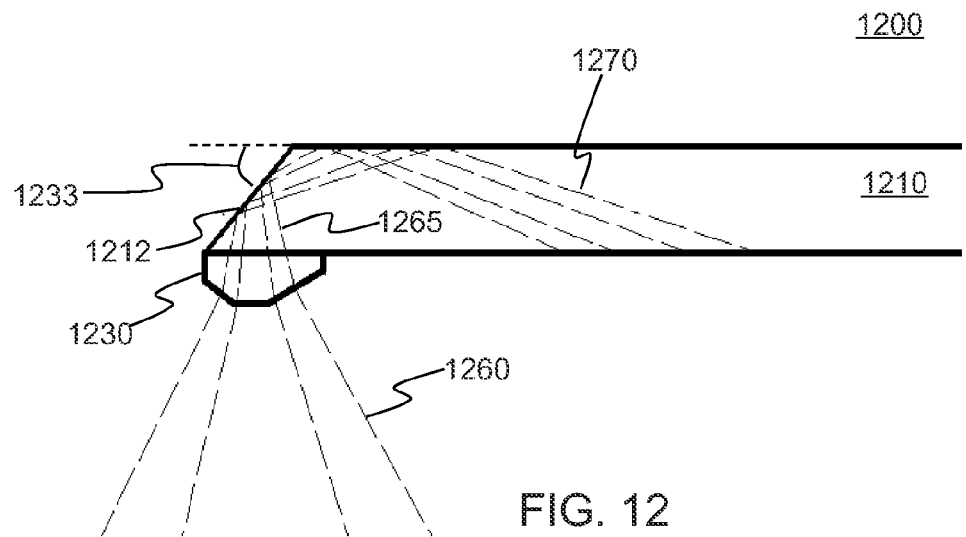

FIG. 12 is a cross-section of a portion of a light concentration system, according to an embodiment 1200. A light collimator 1230, optically attached to a light guide 1210, may comprise a multi-sided prism. Light director 1212 may comprise a flat reflective interior surface at an end region of light guide 1210. In one implementation, such a flat reflective interior surface may reflect light by total internal reflection. In another implementation, a flat reflective surface of light director 1212 may comprise a reflective exterior coating to reflect light internally in light guide 1210. In one implementation, depending at least in part on a focal length of light collimator 1230, light 1260 entering light collimator 1230 may be collimated to produce parallel light 1265. In another implementation, again depending at least in part on a focal length of light collimator 1230, light 1260 entering light collimator 1230 may be collimated to produce light 1265 having a reduced convergence angle or increased f-number compared to light 1260. Light director 1212 may reflect light 1265 at a particular angle based, at least in part, on an angle 1233 of the reflecting surface of light director 1212 with respect to a surface of light guide 1210. Thus, light director 1212 may reflect light 1265 at a particular angle so that the reflected light 1270 travels in light guide 1210 with an angle that allows total internal reflection to occur in light guide 1210. Light 1270 may travel along the interior of light guide 1210 toward an energy converting element, for example, as shown in FIG. 1.

Figure 13:
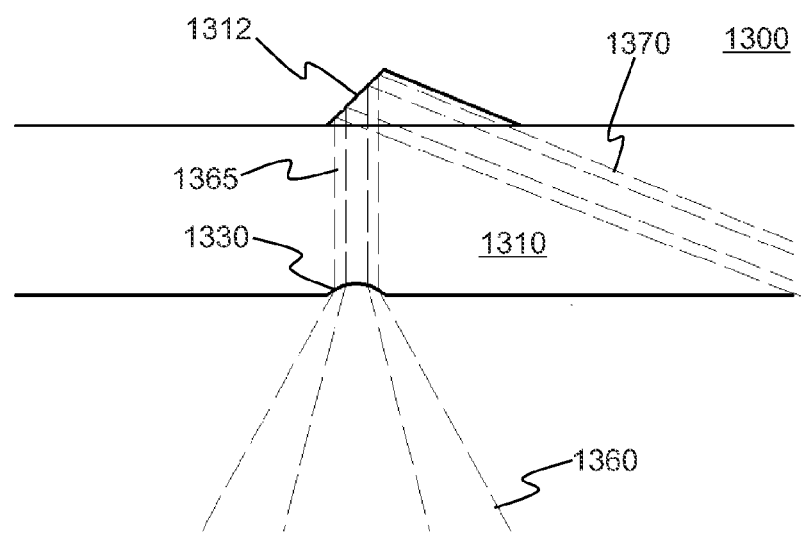
Figure 14:
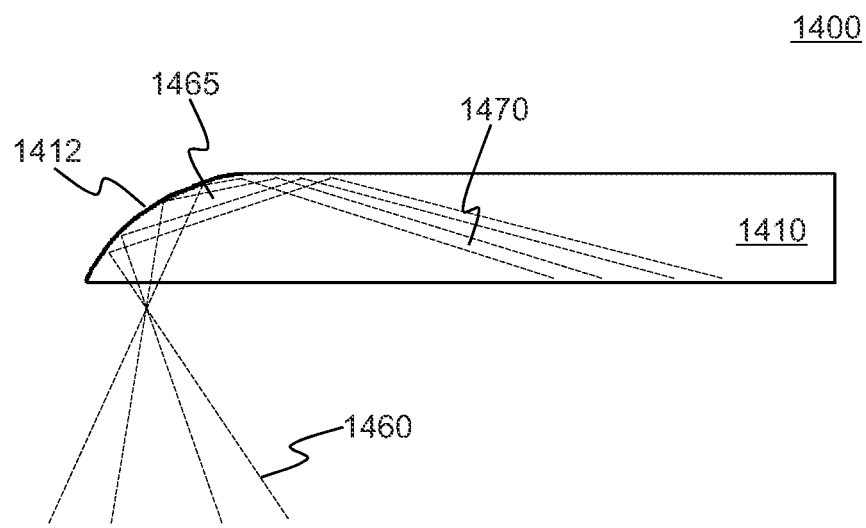

FIG. 13 is a cross-section of a portion of a light concentration system, according to an embodiment 1300. A light collimator 1330 may be built into light guide 1310. In particular, light collimator 1330 may comprise a concave depression in a surface of light guide 1310. Light director 1312 may comprise a prism that is optically attached to a surface of light guide 1310. In one implementation, light director 1312 may comprise an optical element that is not integrated with light guide 1310. Light 1360 entering light collimator 1330 may be collimated to produce light 1365 having a reduced convergence angle or increased f-number compared to light 1360. Light director 1312 may reflect light 1365 at a particular angle so that reflected light 1370 travels in light guide 1310 with an angle that allows total internal reflection to occur in light guide 1310. Light 1370 may travel along the interior of light guide 1310 toward an energy converting element, for example, as shown in FIG. 1. FIG. 14 is a cross-section of a portion of a light concentration system, according to an embodiment 1400. Surface 1412 may comprise a light collimator and a light director, so that light impinging on surface 1412 may be both collimated and directed upon reflection. Surface 1412 may comprise a concave-curved reflective interior surface of an end region of light guide 1410. In one implementation, such a reflective interior surface may reflect light by total internal reflection. In another implementation, a surface 1412 may comprise a reflective exterior coating to reflect light internally in light guide 1410. In one implementation, light 1460 reflecting from surface 1412 may be collimated to produce parallel light 1465. In another implementation, light 1460 reflecting from surface 1412 may be collimated to produce light 1465 having a reduced convergence angle or increased f-number compared to light 1460. Surface 1412 may reflect light 1460 at a particular angle based, at least in part, on a shape or curvature of surface 1412. Thus, surface 1412 may reflect light 1460 at a particular angle so that the reflected light 1465 travels in light guide 1410 with an angle that allows total internal reflection to occur in light guide 1410. Light 1470 may travel along the interior of light guide 1410 toward an energy converting element, for example, as shown in FIG. 1.

Figure 15:
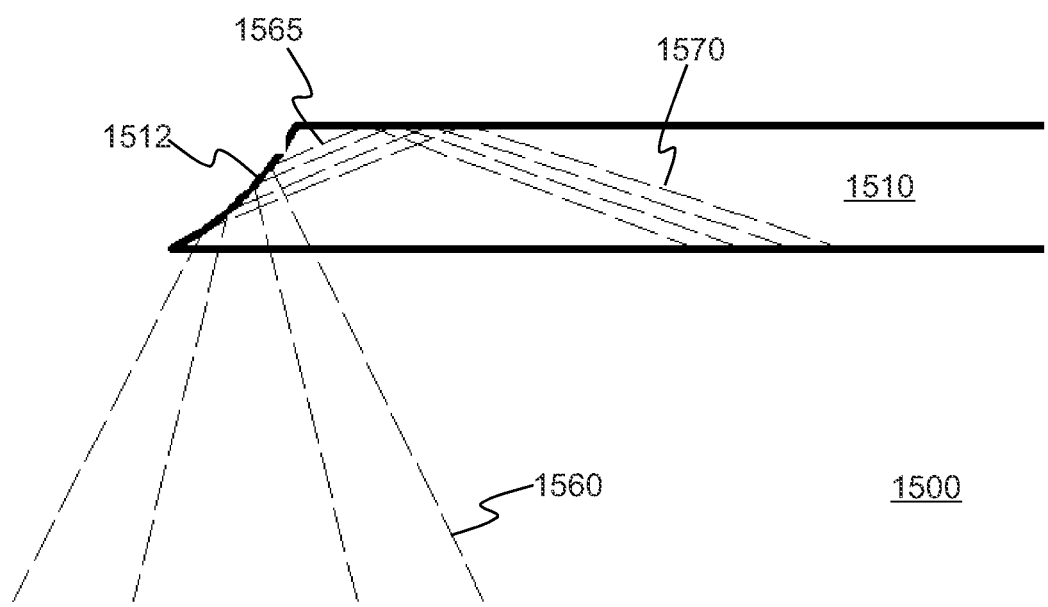

FIG. 15 is a cross-section of a portion of a light concentration system, according to an embodiment 1500. Surface 1512 may comprise a light collimator and a light director, so that light impinging on surface 1512 may be both collimated and directed upon reflection. Surface 1512 may comprise a convex-curved reflective interior surface of an end region of light guide 1510. In one implementation, such a reflective interior surface may reflect light by total internal reflection. In another implementation, a surface 1512 may comprise a reflective exterior coating to reflect light internally in light guide 1510. In one implementation, light 1560 reflecting from surface 1512 may be collimated to produce parallel light 1565. In another implementation, light 1560 reflecting from surface 1512 may be collimated to produce light 1565 having a reduced convergence angle or increased f-number compared to light 1560. Surface 1512 may reflect light 1560 at a particular angle based, at least in part, on a shape or curvature of surface 1512. Thus, surface 1512 may reflect light 1560 at a particular angle so that the reflected light 1565 travels in light guide 1510 with an angle that allows total internal reflection to occur in light guide 1510. Light 1570 may travel along the interior of light guide 1510 toward an energy converting element, for example, as shown in FIG. 1.

Figure 16:
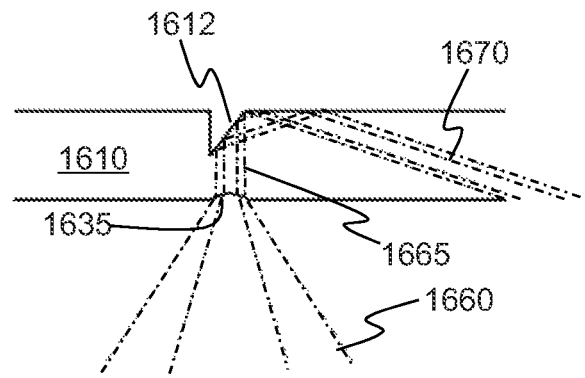

FIG. 16 is a cross-section of a portion of a light concentration system, according to an embodiment 1600. A light collimator 1635 and a light director 1612 may be built into light guide 1610. In particular, light collimator 1635 may comprise a concave depression in a surface of light guide 1610. Light director 1612 may comprise a flat reflective interior surface formed by an angular notch in another surface of light guide 1610. In one implementation, light 1660 entering light collimator 1635 (and light guide 1610) may be collimated to produce parallel light 1665. In another implementation, light 1660 entering light collimator 1635 may be collimated to produce light 1665 having a reduced convergence angle or increased f-number compared to light 1660. Light director 1612 may reflect light 1665 at a particular angle so that reflected light 1670 travels in light guide 1610 with an angle that allows total internal reflection to occur in light guide 1610. Light 1670 may travel along the interior of light guide 1610 toward an energy converting element, for example, as shown in FIG. 1.

Figure 17:
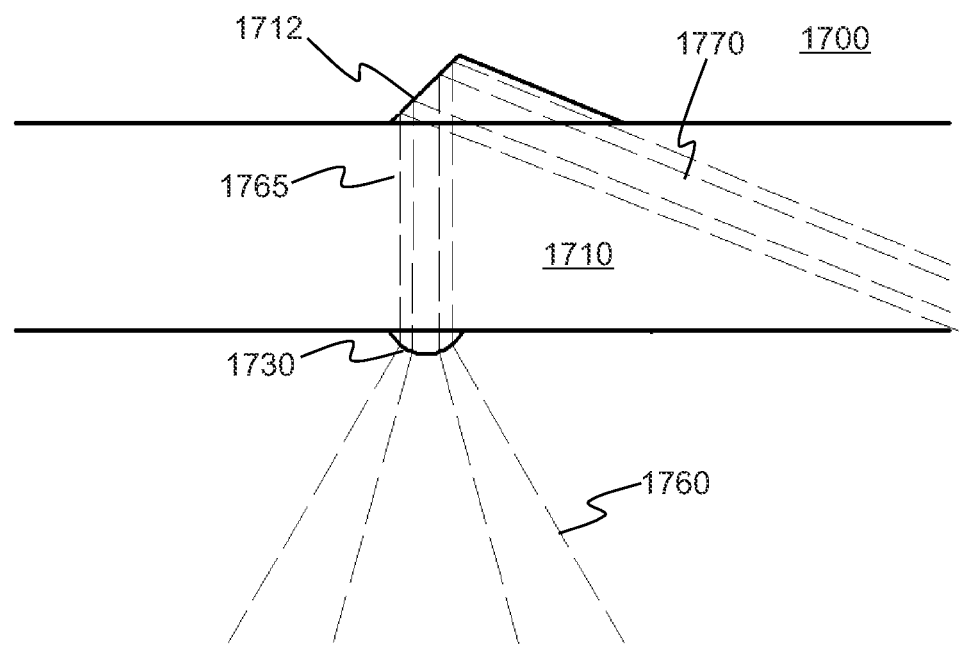

FIG. 17 is a cross-section of a portion of a light concentration system, according to an embodiment 1700. A light collimator 1730 may comprise a convex lens that need not be integrated with light guide 1710. In particular, light collimator 1730 may comprise a convex lens optically contacting a surface of light guide 1710. Light director 1712 may comprise a prism that is optically contacting a surface of light guide 1710. In one implementation, light director 1712 may comprise an optical element that is not integrated with light guide 1710. Light 1760 entering light collimator 1730 may be collimated to produce light 1765 having a reduced convergence angle or increased f-number compared to light 1760. Light director 1712 may reflect light 1765 at a particular angle so that reflected light 1770 travels in light guide 1710 with an angle that allows total internal reflection to occur in light guide 1710. Light 1770 may travel along the interior of light guide 1710 toward an energy converting element, for example, as shown in FIG. 1. One skilled in the art will realize that a virtually unlimited number of variations to the above descriptions is possible, and that the examples and the accompanying figures are merely to illustrate one or more particular implementations.

The terms, "and," "and/or," and "or" as used herein may include a variety of meanings that also is expected to depend at least in part upon the context in which such terms are used. Typically, "or" as well as "and/or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures, or characteristics. Though, it should be noted that this is merely an illustrative example and claimed subject matter is not limited to this example.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. An apparatus comprising:
   a light concentrator to convert incident light to converging light;
   an optical element comprising a light collimating element, a light directing element, and a light guide as separate or integrated elements of said optical element;
   said light collimating element to receive said converging light and to reduce an angle of convergence of said converging light;
   said light directing element to re-direct and transfer said reduced-angle converging light along a portion of said light guide to transmit said directed light; and
   wherein said optical element comprises a curved reflective interior surface for totally internally reflecting said light at a particular angle based, at least in part, on a curvature of said curved reflective interior surface, such that said total internally reflected light enters said light guide at a nonparallel angle that allows total internal reflection to occur in said light guide.

2. The apparatus of claim 1, wherein said light collimating element includes at least one curved surface to perform said reducing the angle of convergence of said converging light.

3. The apparatus of claim 1, wherein said light collimating element includes a multi-sided prism to perform said reducing the angle of convergence of said converging light.

4. The apparatus of claim 1, wherein said light collimating element and said light directing element are integrated elements of said optical element.

5. The apparatus of claim 4, wherein said optical element comprises at least one curved convex or concave surface to reduce the angle of convergence of said converging light.

6. The apparatus of claim 4, further comprising a gap between said light guide and said integrated light collimating element and light directing element.

7. The apparatus of claim 1, wherein said light directing element and said light guide are integrated elements of said optical element.

8. The apparatus of claim 1, wherein said light collimating element and said light guide are integrated elements of said optical element.

9. The apparatus of claim 1, wherein said light collimating element, said light directing element, and said light guide are integrated elements of said optical element.

10. The apparatus of claim 9, wherein said optical element comprises at least one curved surface to reduce the angle of convergence of said converging light.

11. The apparatus of claim 1, wherein said light collimating element is a separate element of said optical element relative to said light guide.

12. The apparatus of claim 1, wherein said light directing element is a separate element of said optical element relative to said light guide.

13. The apparatus of claim 1, wherein said light guide comprises a rod-type light guide.

14. The apparatus of claim 13, wherein said light guide includes at least two opposing plane surfaces, wherein said transmitted light travels from an entry-end surface toward an exit-end surface.

15. The apparatus of claim 1, further comprising an energy conversion element to receive said reduced-angle converging light via said light guide.

16. The apparatus of claim 15, wherein said energy conversion element comprises at least one device to convert said received light to other forms of energy.

17. The apparatus of claim 1, wherein said light concentrator comprises a curved mirror.

18. The apparatus of claim 17, wherein said light concentrator further comprises a secondary curved mirror.

19. The apparatus of claim 1, wherein said light concentrator comprises a refractive lens.

20. The apparatus of claim 1, wherein said light collimating element and light directing element are integrated in a shaped end of said light guide, and said shaped end comprises a curved surface.

21. The apparatus of claim 1, wherein a side of said light guide comprises a notch and another side of said light guide comprises a convex or concave shaped surface, and wherein said notch comprises said light directing element and said indentation comprises said light collimating element.

22. The apparatus of claim 1, wherein said light collimating element and said light directing element are to receive said converging light at a focus point of said light concentrator.

23. A method comprising:
    collecting and focusing incident light from a light concentrator onto a light collimating element to increase an f-number of said incident light, wherein said f-number of said incident light represents a quantitative measure of a steepness of a cone of said incident light;
    steering and transferring said f-number-increased light received from said light collimating element via a curved reflective interior surface of a light directing element configured for total internally reflecting said f-number-increased light at a particular angle based, at least in part, on a curvature of said curved reflective interior surface, said f-number-increased light entering a light guide at a nonparallel angle that allows total internal reflection to occur in said light guide; and
    transmitting said steered light to an energy converting device via said light guide.

24. The method of claim 23, wherein said increasing said f-number of said incident light is performed by a curved surface of an optical element.

25. The method of claim 23, further comprising combining steered light from a plurality of said light collimating elements.

* * * * *